United States Patent
Shida et al.

(10) Patent No.: US 9,245,757 B2
(45) Date of Patent: Jan. 26, 2016

(54) LASER ANNEALING TREATMENT APPARATUS AND LASER ANNEALING TREATMENT METHOD

(75) Inventors: Junichi Shida, Kanagawa (JP); Suk-Hwan Chung, Kanagawa (JP); Masashi Machida, Kanagawa (JP)

(73) Assignee: The Japan Steel Works, Ltd, Tokyo (JP)

( * ) Notice: Subject to any disclaimer, the term of this patent is extended or adjusted under 35 U.S.C. 154(b) by 60 days.

(21) Appl. No.: 13/808,875

(22) PCT Filed: Sep. 17, 2010

(86) PCT No.: PCT/JP2010/066178
§ 371 (c)(1),
(2), (4) Date: Feb. 7, 2013

(87) PCT Pub. No.: WO2012/004903
PCT Pub. Date: Jan. 12, 2012

(65) Prior Publication Data
US 2013/0210242 A1    Aug. 15, 2013

(30) Foreign Application Priority Data
Jul. 5, 2010    (JP) .................................. 2010-152988

(51) Int. Cl.
*B23K 26/06* (2014.01)
*B23K 26/064* (2014.01)
(Continued)

(52) U.S. Cl.
CPC ............ *H01L 21/268* (2013.01); *B23K 26/063* (2013.01); *B23K 26/0853* (2013.01); *B23K 26/12* (2013.01); *B23K 26/127* (2013.01); *H01L 21/02532* (2013.01); *H01L 21/02686* (2013.01)

(58) Field of Classification Search
CPC ............ H01L 21/02686; H01L 21/268; B23K 26/063; B23K 26/0853; B23K 26/12; B23K 26/127

USPC .................. 438/166, 795; 219/121.6, 121.61, 219/121.64, 121.73, 121.74, 121.75, 219/121.76, 121.82, 121.85, 385; 250/492.2, 492.22, 492.23
See application file for complete search history.

(56) References Cited

U.S. PATENT DOCUMENTS 5,346,850 A * 9/1994 Kaschmitter et al. ......... 438/487
5,487,059 A * 1/1996 Saito ....................... G11B 7/126
                                                          369/116
(Continued)

FOREIGN PATENT DOCUMENTS

FR    2 792 112    *  4/1999 ............ H01L 21/322
JP    06-005537 A1    1/1994
(Continued)

OTHER PUBLICATIONS

International Preliminary Search Report on Patentability for PCT/JP2010/066178 (in English); Oct. 26, 2010.*
(Continued)

*Primary Examiner* — Mary Wilczewski
(74) *Attorney, Agent, or Firm* — Baker Hostetler

(57) ABSTRACT

Provided is a laser annealing treatment including a laser light source that outputs pulse laser light, an optical system that shapes the pulse laser light, and leads the shaped pulse laser light to a semiconductor film subject to treatment, and a stage that carries the semiconductor film to be irradiated by the pulse laser light, wherein the pulse laser light irradiating the semiconductor film presents a rising time equal to or less than 35 nanoseconds from 10% of the maximum height to the maximum height in the pulse energy density, and a falling time equal to or more than 80 nanoseconds from the maximum height to 10% of the maximum height, thereby increasing, while an energy density suitable for crystallization and the like is not particularly increased, a margin quantity thereof, and carrying out high quality annealing treatment without decreasing a throughput.

5 Claims, 6 Drawing Sheets

(51) Int. Cl.
  *B23K 26/067* (2006.01)
  *H01L 21/268* (2006.01)
  *H01L 21/02* (2006.01)
  *B23K 26/08* (2014.01)
  *B23K 26/12* (2014.01)

(56) References Cited

U.S. PATENT DOCUMENTS

| | | | |
|---|---|---|---|
| 5,759,419 A | | 6/1998 | Mochida et al. |
| 5,773,309 A | * | 6/1998 | Weiner .......................... 438/166 |
| 5,869,803 A | * | 2/1999 | Noguchi et al. ......... 219/121.62 |
| 6,972,268 B2 | * | 12/2005 | Ehrmann et al. .............. 438/795 |
| 8,526,473 B2 | * | 9/2013 | Baird et al. ..................... 372/25 |
| 2002/0162973 A1 | * | 11/2002 | Cordingley et al. ....... 250/492.2 |
| 2012/0234810 A1 | * | 9/2012 | Kudo ................... H01L 21/268 |
| | | | 219/121.85 |
| 2012/0276754 A1 | * | 11/2012 | Cordingley et al. .......... 438/795 |
| 2013/0210242 A1 | * | 8/2013 | Shida et al. ................... 438/795 |

FOREIGN PATENT DOCUMENTS

| | | |
|---|---|---|
| JP | 09-161264 A1 | 6/1997 |
| JP | 10-012549 A1 | 1/1998 |
| JP | 2000-021776 A1 | 1/2000 |
| JP | 2001-319891 A1 | 11/2001 |
| JP | 2002-176006 A1 | 6/2002 |
| JP | 2002-217104 A1 | 8/2002 |
| JP | 2002-305145 A1 | 10/2002 |
| JP | 2002-541679 A1 | 12/2002 |
| JP | 2003-163167 A1 | 6/2003 |
| JP | 2003-273040 A1 | 9/2003 |
| WO | WO00/62336 A1 | 10/2000 |

OTHER PUBLICATIONS

TW Office Action dd Jan. 23, 2015, Notice of Opinion on Examination #10420092720.
KR Office Action, Notification of Reasons for Refusal, dd Apr. 30, 2015, KR2012-7031328.
IP Office of Singapore, Written Opinion, Oct. 20, 2014, 2013000153-WRO.

* cited by examiner

LASER ANNEALING TREATMENT APPARATUS AND LASER ANNEALING TREATMENT METHOD

TECHNICAL FIELD

The present invention relates to a laser annealing treatment apparatus which irradiates a semiconductor film with pulse laser light, thereby carrying out laser annealing, and a laser annealing treatment method.

BACKGROUND ART

Laser annealing using laser light is carried out as a part of a manufacturing method which is a low temperature process for a thin film transistor used for a pixel switch and a drive circuit for a liquid crystal display and an organic EL (Electra Luminescence display. This method irradiates a non single-crystalline semiconductor film formed on a substrate with laser light, thereby locally heating and melting the semiconductor thin film, or heating the semiconductor thin film without melting, and then crystallizes the semiconductor thin film into a polycrystalline film or single-crystalline film in a cooling process. The crystallized semiconductor thin film presents high mobility of carriers, thereby increasing the performance of the thin film transistor. Moreover, the laser annealing treatment applied to the crystalline semiconductor thin film can also carry out modification.

Regarding the irradiation of the laser light, a method of shaping pulse laser light into a rectangular form or a line form, and carrying out overlap irradiation while scanning the pulse laser light, thereby annealing semiconductor is proposed (for example, refer to Patent Literature).

Homogeneous treatment needs to be carried out over the semiconductor film when the laser light irradiates, and control to adjust laser output within a predetermined range, and control to adjust pulse energy within a predetermined range by means of an attenuator is generally carried out so that the irradiating laser light has a stable pulse energy density.

CITATION LIST

Patent Literature

Patent Literature 1: Japanese Patent Application Laid-open No. 6-5537

SUMMARY OF THE INVENTION

Problems to be Solved by the Invention

By the way, the semiconductor film crystallized by the irradiation of the pulse laser light presents an excellent property as a semiconductor element brought about by a fact that crystal grains large in grain diameter are uniformly present. Therefore, the irradiating pulse laser light for the laser annealing needs to have an energy density which is not excessive or deficient, and which is thus within a range suitable for the crystallization.

Though the laser output is controlled so that the laser output falls within a range suitable for the crystallization in the laser annealing in this way, the conventional pulse laser light poses such a problem that a proper range of the laser output is narrow, namely a margin is small, resulting in a heavy load imposed upon an apparatus for the control, and a crystal property tends to vary due to fluctuation in output.

The conventional pulse laser light has a pulse waveform steep both in rising and falling as shown in FIG. 6, and the inventors have found that, by changing the waveform into a broad pulse waveform, an energy density itself suitable for the crystallization is increased, and a range thereof is increased relatively wide.

However, the increase in the energy density suitable for the crystallization means that the pulse energy density needs to be increased by decreasing an irradiated area of the pulse laser light. If the irradiated area of the pulse laser light is decreased, the number of times of the pulse irradiation for treating one surface of the semiconductor film necessarily increases, resulting in a decrease in throughput.

The present invention is devised in view of the foregoing problem, and has an object of providing a laser annealing treatment apparatus and a treatment method which can increase the range of the energy density, namely the proper margin, suitable for the crystallization and the like while restraining a decrease in throughput as much as possible.

Means of Solving the Problems

That is, a laser annealing treatment apparatus according to the present invention in a first aspect, includes a laser light source that outputs pulse laser light, an optical system that shapes the pulse laser light, and leads the shaped pulse laser light to a semiconductor film subject to treatment, and a stage to be set the semiconductor film to be irradiated by the pulse laser light, where the pulse laser light irradiating the semiconductor film presents a rising time equal to or less than 35 nanoseconds from 10% of the maximum height to the maximum height in the pulse energy density, and a falling time equal to or more than 80 nanoseconds from the maximum height to 10% of the maximum height.

The laser annealing treatment apparatus in a second aspect of the present invention in a first aspect is characterized in that the rising time is equal to or less than 30 nanoseconds, and the falling time is equal to or more than 85 nanoseconds.

The laser annealing treatment apparatus in a third aspect of the present invention in the first aspect or the second aspect is characterized in that the apparatus includes a waveform shaping unit that shapes the pulse laser light output from the laser light source into a pulse waveform having the rising time and the falling time.

The laser annealing treatment apparatus in a fourth aspect of the present invention in the third aspect is characterized in that the waveform shaping unit includes beam splitting means that splits the pulse laser light output from the laser light source into a plurality of beams, delay means that delays each of the split beams, and beam synthesizing means that synthesizes the respective split beams.

The laser annealing treatment apparatus in a fifth aspect of the present invention in any one of the first to fourth aspect is characterized in that the apparatus includes a plurality of laser light sources, wherein beams of the pulse laser light output from the respective laser light are superimposed, thereby obtaining the pulse laser light irradiating the semiconductor film.

The laser annealing treatment apparatus in a sixth aspect of the present invention in any one of the first to fifth aspect is characterized in that the semiconductor film to be irradiated by the pulse laser light is non single-crystalline silicon.

The laser annealing treatment apparatus in a seventh aspect of the present invention in any one of the first to sixth aspect is characterized in that the pulse laser light is excimer laser.

A laser annealing treatment method according to the present invention includes obtaining pulse laser light which presents a rising time equal to or less than 35 nanoseconds from 10% of the maximum height to the maximum height in the pulse energy density, and a falling time equal to or more than 80 nanoseconds from the maximum height to 10% of the maximum height in a pulse waveform, and relatively scanning the pulse laser light with respect to a semiconductor film while the pulse laser light is irradiating the semiconductor film, thereby carrying out surface treatment of the semiconductor film.

That is, according to the present invention, the pulse laser light having the properly defined rising time and falling time irradiates the semiconductor film, and the annealing treatment can thus be carried out at a proper pulse energy density having a large margin. Moreover, the pulse energy density suitable for the crystallization and the like can be restrained to a relatively small value, and an irradiated area can thus be increased as much as possible, resulting in a treatment being carried out at an appropriate throughput.

If the rising time exceeds 35 nanoseconds, the pulse energy density suitable for the crystallization and the like increases, and the irradiated area of the pulse laser light needs to be reduced. Therefore, the rising time is set to be equal to or less than 35 nanoseconds. For the same reason, the rising time is preferably equal to or less than 30 nanoseconds.

If the falling time is less than 80 nanoseconds, the margin in the pulse energy density suitable for the crystallization and the like decreases, the load imposed on the apparatus increases, and it is hard to obtain uniform crystals. Therefore, the falling time is set to be equal to or more than 80 nanoseconds. For the same reason, the falling time is preferably equal to or more than 85 nanoseconds.

It should be noted that the rising time is defined as a time from the 10% of the maximum height of a pulse waveform to the maximum height in the present invention. The falling time is defined as a time from the maximum height of the pulse waveform to the 10% of the maximum height in the present invention.

The pulse waveform having the rising time and the falling time described above may be a waveform which the pulse laser light output from the laser light source has, or a waveform which is obtained by the waveform shaping unit shaping the pulse waveform. As a result, the desired waveform can be acquired without using a special laser light source. A waveform shaping unit using the delay means can be mentioned as the waveform shaping unit. If the delay means is used, the waveform shaping unit includes beam splitting means that splits the pulse laser light output from the laser light source into multiple beams, the delay means that delays each of the split beams, and beam synthesizing means that synthesizes the respective split beams. The pulse waveform can be shaped to a proper waveform by setting a delayed quantity in the delay means. The delay means can change the delayed quantity by adjusting an optical path length.

For example, the beams of the laser split by the beam splitting means are respectively led to optical systems different in optical path length. A pulse time width can be extended, and the pulse waveform can be adjusted by leading again the beams split and delayed to a single optical path. Particularly, the pulse time waveform can be properly changed by adjusting an intensity ratio upon the split, and the setting for the respective optical path lengths after the split.

Moreover, the pulse waveform having the above-described rising time and falling time can be obtained by superimposing pulse laser lights output from a plurality of laser light sources. The waveform may be obtained by synthesizing the plurality of pulse laser lights into a single of pulse laser light in advance, and irradiating the semiconductor film with the single pulse laser light, or by irradiating the semiconductor film with the plurality of pulse laser lights, resulting in irradiation at an energy density which consequently realizes the desired waveform. When the plurality of the pulse laser lights are superimposed, the desired pulse waveform may be obtained by adjusting phases of the pulse outputs, or interposing delay means.

Though the present invention is preferably used to crystallize an amorphous silicon film, the present invention is not limited to specific types of a material and specific purposes. For example, the present invention may be applied to modification by irradiating a crystalline semiconductor film with pulse laser light. As the pulse laser light, though excimer laser light having a high output can be preferably used, the present invention is not limited to the excimer laser light.

Effects of the Invention

As described above, the laser annealing treatment apparatus according to the present invention includes a laser light source that outputs pulse laser light, an optical system that shapes the pulse laser light, and leads the shaped pulse laser light to a semiconductor film subject to the treatment, and a stage that carries the semiconductor film to be irradiated by the pulse laser light, wherein the pulse laser light irradiating the semiconductor film presents a rising time equal to or less than 35 nanoseconds from 10% of the maximum height to the maximum height in the pulse energy density, and a falling time equal to or more than 80 nanoseconds from the maximum height to 10% of the maximum height, and the margin quantity proper for the crystallization and the like can thus be secured while the energy density suitable for the crystallization and the like is not particularly increased, and uniform annealing treatment can be carried out without increasing the load imposed on the apparatus, and decreasing the throughput.

MODE FOR CARRYING OUT THE INVENTION

Figure 1:
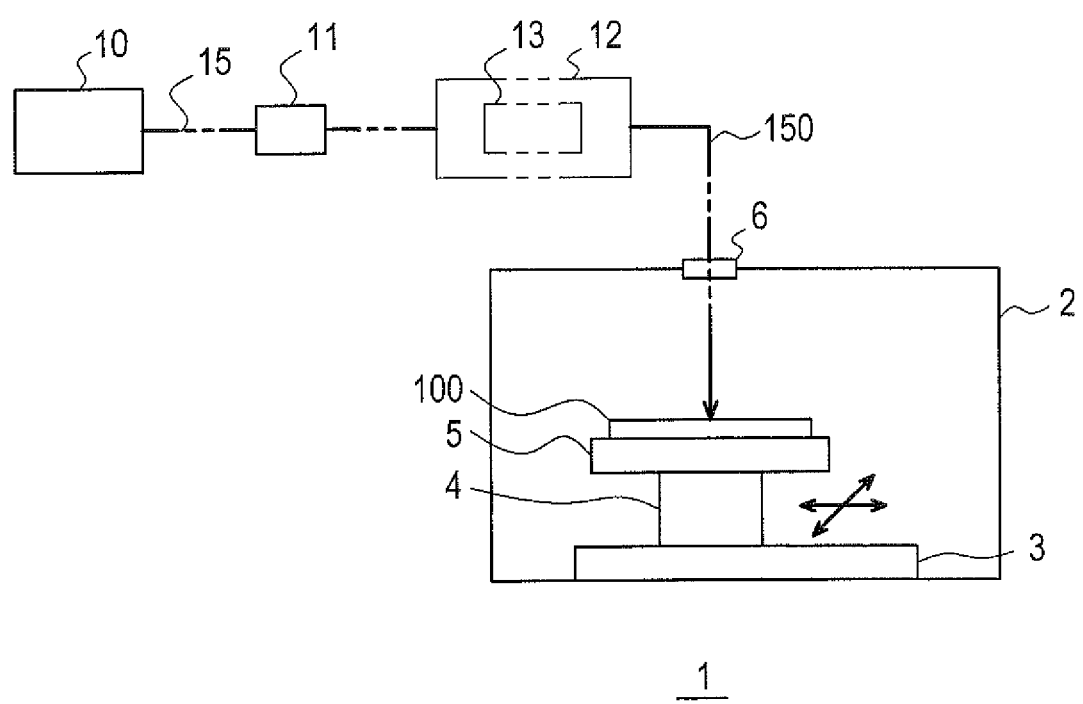
FIG. 1 is a schematic diagram showing a laser annealing treatment apparatus according to an embodiment of the present invention.

A description will now be given of an embodiment of the present invention. FIG. 1 is a diagram showing an overview of a laser annealing treatment 1 according to the present invention.

The laser annealing treatment apparatus 1 includes a treatment chamber 2, a scan device 3 which can travel in X and Y directions in the treatment chamber 2, and a base 4 on a top portion of the scan device 3. A substrate arrangement stand 5 is provided as a stage on the base 4. An amorphous silicon film 100 or the like is placed as a semiconductor film on the substrate arrangement stand 5 during annealing treatment. The silicon film 100 is formed to a thickness of 50 nanometers on a substrate, which is not shown. The formation can be carried out by an ordinary method, and the method of forming the semiconductor film is not specifically limited by the present invention.

The scan device 3 is driven by motors or the like, which are not shown. An introduction window 6 which introduces pulse laser light from the outside is provided on the treatment chamber 2.

A pulse laser light source 10 is provided outside the treatment chamber 2. The pulse laser light source 10 is constituted by an excimer laser oscillator, and can output pulse laser light which has a wavelength of 308 nanometers, a repetition oscillation frequency of 300 Hz, a pulse rising time of <5 nanoseconds, and a pulse falling time of approximately 45 nanoseconds, and feedback control is provided so that the output of the pulse laser light is maintained in a predetermined range in the pulse laser light source 10.

The pulse laser light 15 output by means of pulse oscillation in the pulse laser light source 10 is adjusted in energy density by an attenuator 11 according to necessity, undergoes beam shaping and deflection by an optical system 12 constituted by lenses, reflection mirrors, homogenizers, and the like, and irradiates the amorphous silicon film 100 in the treatment chamber 2 through the introduction window provided on the treatment chamber 2. A shape of an irradiated surface upon the irradiation is not specifically limited, and is shaped by the optical system 12 into a spot shape, a circular shape, a rectangular shape, or a long shape.

The optical system 12 includes a waveform shaping unit 13. A description will now be given of an outline of the waveform shaping unit 13 referring to FIG. 2.

A beam splitter 130 constituted by a half mirror is arranged on an optical path in the waveform shaping unit 13, the beam is split so that a part 15a of the beam is reflected by 90 degrees, and the remaining beam 15b transmits. That is, the beam splitter 130 corresponds to beam splitting means of the present invention. A total reflection mirror 131 is arranged in the reflected direction of the beam splitter 130 so that an incident angle is 45 degrees, a total reflection mirror 132 is arranged in a reflected direction of the total reflection mirror 131 so that an incident angle is 45 degrees, a total reflection mirror 133 is arranged in a reflected direction of the total reflection mirror 132 so that an incident angle is 45 degrees, and a total reflection mirror 134 is arranged in a reflected direction of the total reflection mirror 133 so that an incident angle is 45 degrees.

A rear surface side of the beam splitter 130 is arranged in a reflected direction of the total reflection mirror 134, and is irradiated by the beam at an incident angle of 45 degrees.

The beam 15a reflected by 90 degrees by the beam splitter 130 is reflected each time by 90 degrees successively by the total reflection mirrors 131, 132, 133, and 134 becomes a delayed beam 15c, and reaches the rear surface side of the beam splitter 130, part of the beam 15c is reflected by 90 degrees, and is superimposed in the delayed form on the beam 15b, and the remaining beam transmits through the beam splitter 130, and repeats the total reflections and the split by the beam splitter 130. The beams superimposed each other on the beam 15b side are shaped in the pulse waveform by superimposing the delayed beam, present a pulse waveform steep in the rising, and gentle in the falling, and travel as pulse laser light 150 on the optical path. Specifically, the pulse laser light 150 is shaped into such a pulse waveform that has a rising time equal to or less than 35 nanoseconds from 10% of the maximum height to the maximum height in the pulse energy density, and a falling time equal to or more than 80 nanoseconds from the maximum height to 10% of the maximum height. The delayed quantity of the beam can be changed by changing the positions of the respective total reflection mirrors, thereby adjusting the optical path length, and, as a result, the pulse waveform of the superimposed pulse laser light can be arbitrarily changed. The intensity of the split pulse laser light may be individually adjusted.

The pulse laser light 150 is introduced into the treatment chamber 2 through the introduction window 6, and irradiates the silicon film 100 on the substrate arrangement stand 5. On this occasion, the substrate arrangement stand 5 is moved along with the base 4 by the scan device 3, and the pulse laser light 150 irradiates the silicon film 100 while the pulse laser light 150 is relatively scanned on the silicon film 100.

On this occasion, the pulse laser light 150 is set in terms of the output of the laser light source 10, the attenuation ratio of the attenuator 11, and an irradiation cross sectional area of the pulse laser light so as to obtain an energy density suitable for the crystallization, and uniformly crystallizes the amorphous silicon film 100.

It should be noted that a part of the pulse laser light 150 may be extracted, and the pulse energy density may be measured at a position equivalent to the irradiated surface. The pulse laser light source 10 and the attenuator 11 may be adjusted based on a result of the measurement, thereby adjusting the pulse energy density of the pulse laser light 150 to the proper value.

The silicon film 100 crystallized by the irradiation of the pulse laser light 150 is so excellent in crystal property that the crystal grains are relatively large, and the crystal grain diameter is uniform. It should be noted that the margin of the proper pulse energy density is large on this occasion, the apparatus load can be reduced, and the uniformity of the annealing treatment can be secured even if the laser output fluctuates. Moreover, the energy density suitable for the crystallization and the like can be set to a relatively low energy density, and the throughput can be increased by increasing the irradiated cross sectional area of the pulse laser light.

EXAMPLE 1

A description will now be given of an example and a comparative example of the present invention.

Figure 2:
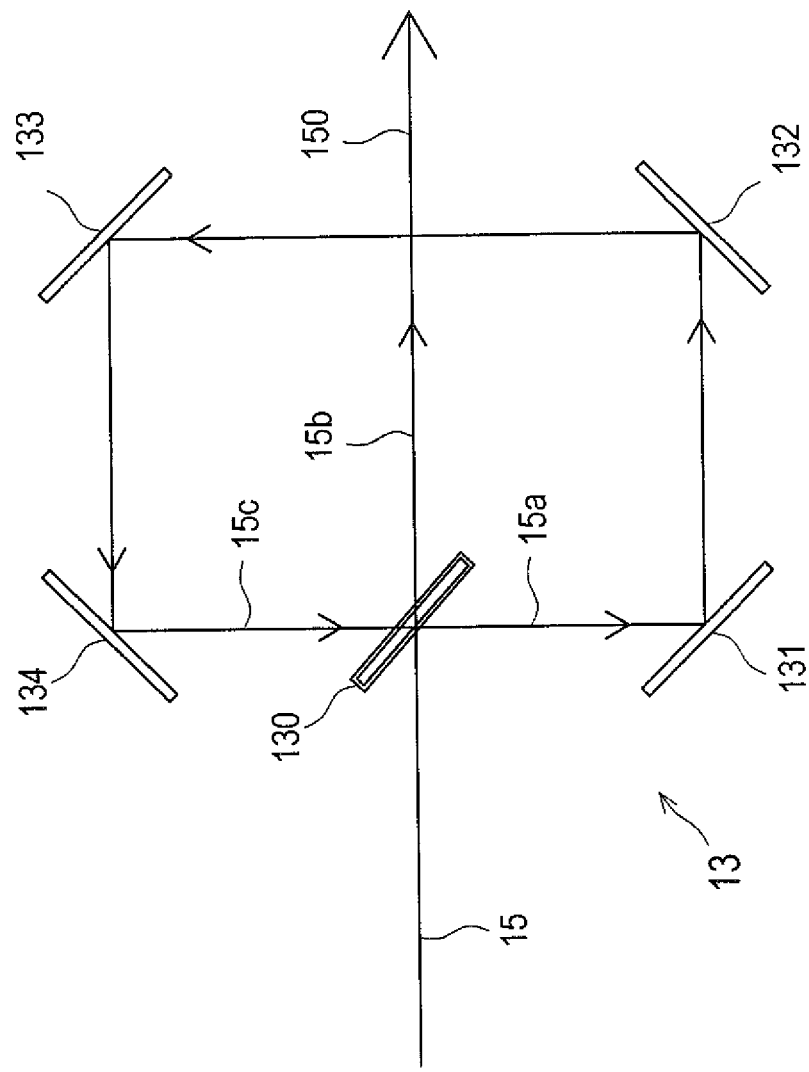
FIG. 2 is a schematic diagram showing a wave shaping unit according to the embodiment of the present invention.

The laser annealing treatment apparatus 1 shown in FIGS. 1 and 2 were used, and the delayed quantity of the waveform shaping unit 13 was adjusted, thereby obtaining beams of pulse laser light respectively having pulse waveforms different in the rising time and the falling time. It should be noted the shape of the irradiated surface of the pulse laser light is a line beam shape of 465 mm and 0.4 mm in width, in this example.

Figure 3:
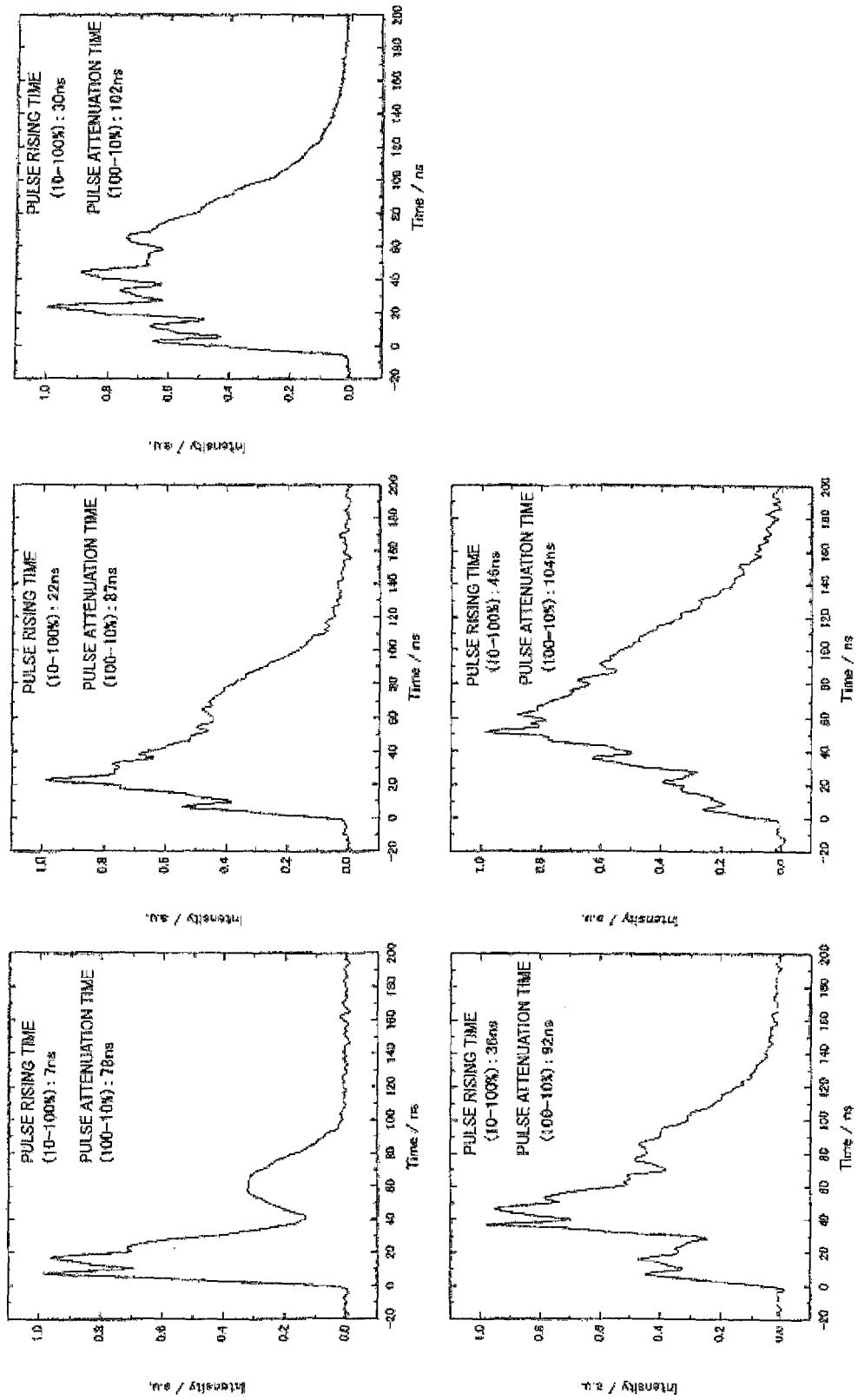
FIG. 3 is a diagram showing respective pulse waveforms of pulse laser light used for examples of the present invention.

FIG. 3 shows pulse waveforms of the respective pulse laser lights, and specifically describes rising times and falling times in charts. It should be noted that the falling times are described as pulse attenuation times in the charts.

The pulse laser light having the pulse waveforms were changed in the pulse energy density, and irradiated the amorphous silicon film 100, and the crystal property was evaluated. It should be noted that the pulse energy density was changed mainly by adjusting the attenuation rate in the attenuator 11.

The evaluation of the crystal property was carried out by checking the surface of the crystallized silicon film by an electron microscope, and a surface formed by large crystal grains, and uniform in the grain diameter was determined as high quality. Crystal grains equal to or more than 200 nanometers, for example, were determined to be excellent.

Optimum crystallization pulse energy densities were obtained respectively in terms of the size and the uniformity of the crystal grains for each of the pulse waveforms. Upper and lower limits for the pulse energy density suitable for the crystallization were obtained for the pulse lasers light other than the pulse laser light having a rising time of 51 nanoseconds.

Figure 4:
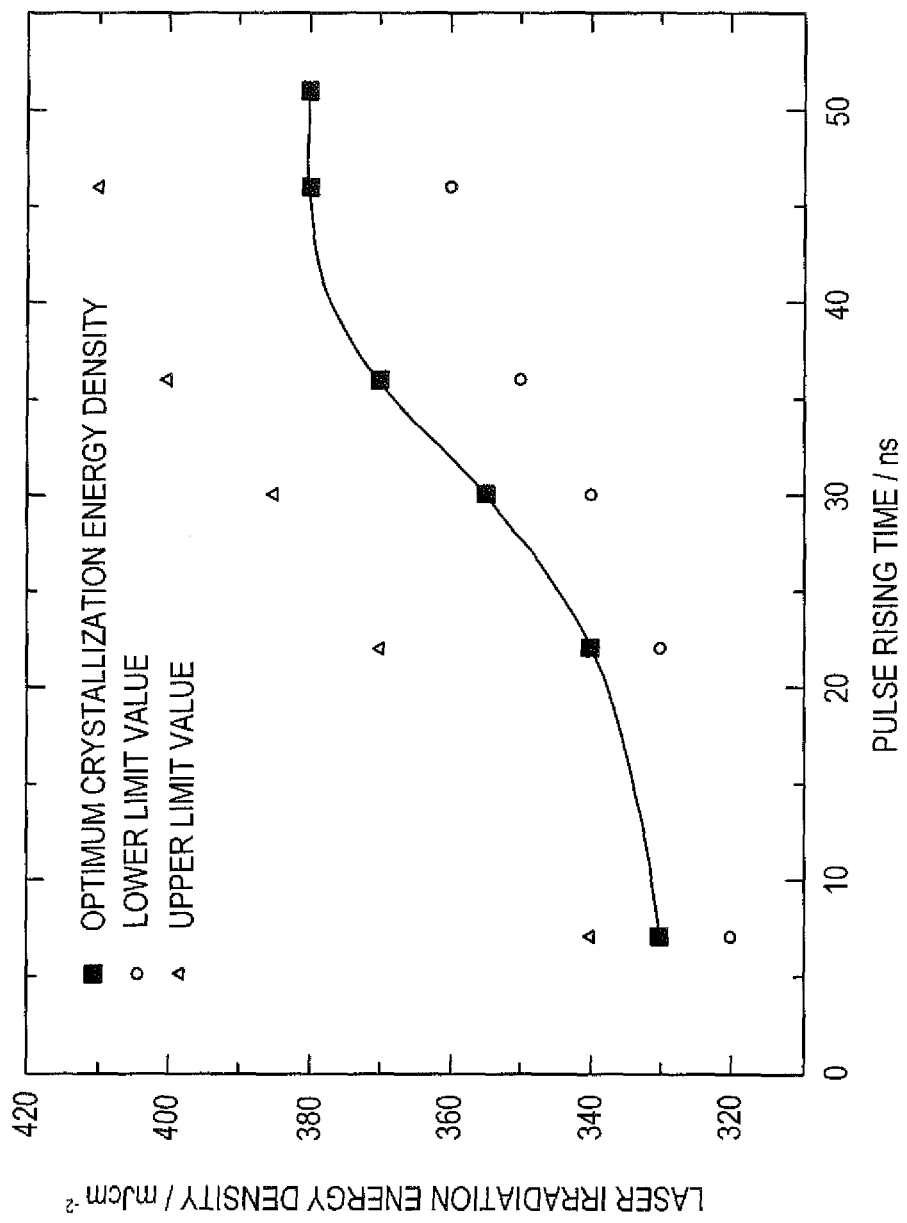
FIG. 4 is a diagram showing a relationship between a pulse rising time and a margin of a pulse energy density.

FIG. 4 shows the irradiation result obtained by using the pulse laser light of the respective pulse waveforms. It is appreciated that, as the pulse rising time decreases, the optimum pulse energy density gradually decreases, and the optimum energy density sharply decreases if the pulse rising time is equal to or less than 35 nanoseconds. Therefore, the rising time needs to be equal to or less than 35 nanoseconds. The optimum pulse energy density remarkably decreases if the rising time is equal to or less than 30 nanoseconds.

Figure 5:
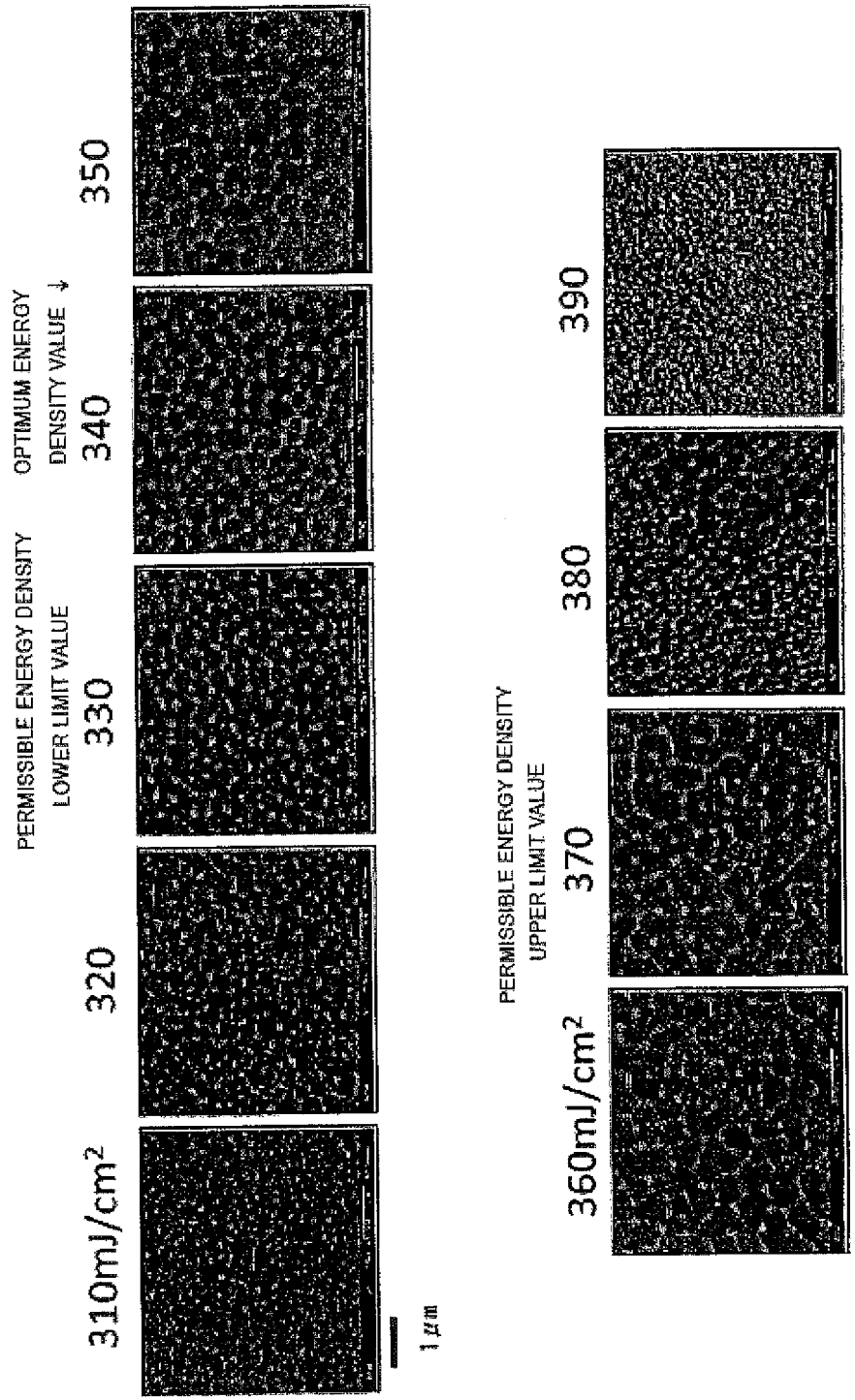
FIG. 5 is a photograph substituting drawing showing surface of crystals of a silicon thin film after irradiation of pulse laser light according to examples of the present invention.
Figure 6:
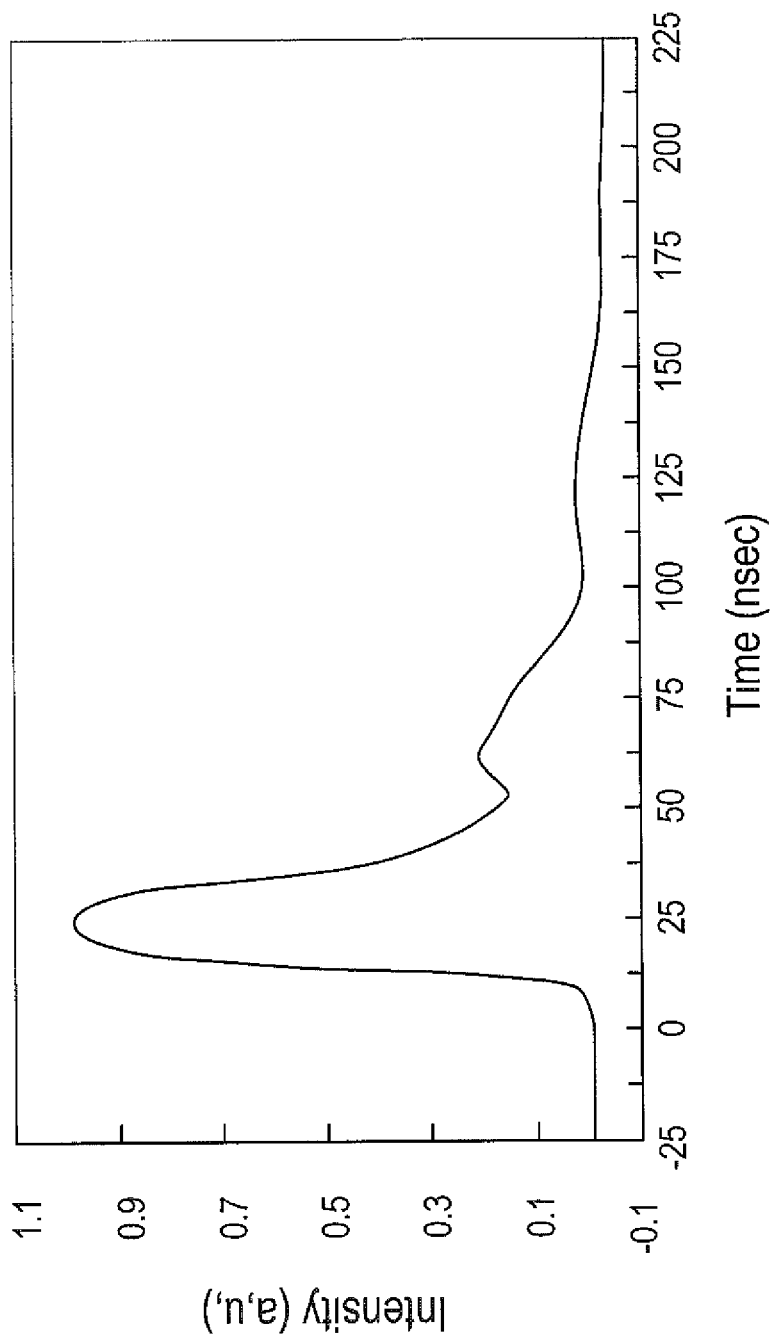
FIG. 6 is a diagram showing a pulse waveform of pulse laser light used for a conventional laser annealing treatment apparatus.

FIG. 5 shows electron microscope photographs obtained by irradiating pulse laser light having a pulse waveform with the pulse rising time of 22 nanoseconds and the pulse falling time of 87 nanoseconds on an amorphous silicon film, and observing the surfaces of the crystallized silicon films by an electron microscope. It is appreciated, from the photographs, that the pulse energy density range suitable for the crystallization is 330-370 mJ/cm$^2$ and an optimum pulse energy density is 340 mJ/cm$^2$. If the pulse laser light irradiates at a pulse energy density lower than the pulse energy density suitable for the crystallization, the obtained crystals present a small crystal grain diameter. If the pulse laser light irradiates at a pulse energy density higher than the pulse energy density suitable for the crystallization, the obtained crystals present a large variation in the crystal grain diameter, and as the energy density further increases, the crystal grains become smaller.

However, for the pulse laser light having the rising time of 7 nanoseconds, though the pulse energy density suitable for the crystallization decreases, the quantity of the margin for providing the proper range sharply decreases. This is because the falling time is 78 nanoseconds, which is less than 80 nanoseconds.

Thus, both the rising time and the falling time need to meet the conditions according to the present invention.

Though the present invention is described based on the embodiment and the example, the present invention is not limited to the contents of the description, and may be properly modified as long as the modification does not depart from the present invention.

DESCRIPTION OF REFERENCE NUMERAL 1 laser annealing treatment apparatus
2 treatment chamber
3 scan device
5 substrate arrangement stand
6 introduction window
10 pulse laser light source
11 attenuator
12 optical system
13 waveform shaping unit
15 pulse laser light
100 silicon film
150 pulse laser light

What is claimed is:

1. A laser annealing treatment apparatus that crystallize a semiconductor comprising:
    a laser light source that outputs pulse laser light;
    an optical system that shapes the pulse laser light, and leads the shaped pulse laser light to a semiconductor film subject to treatment;
    a stage to be set for irradiating the semiconductor film by the pulse laser light; and
    a waveform shaping unit that shapes the pulse laser light output from the laser light source into a pulse waveform having a rising time and a falling time,
    wherein the waveform shaping unit comprises beam splitting means that splits a plurality of times the pulse laser light output from the laser light source into a plurality of beams and delay means that delays each of the split beams, and
    wherein the waveform shaping unit shapes the pulse laser light output from the laser light source so that the pulse laser light waveform irradiating the semiconductor film includes a rising time equal to or less than 30 nanoseconds from 10% of the maximum height to the maximum height in the pulse energy density, and a falling time equal to or more than 85 nanoseconds from the maximum height to 10% of the maximum height.

2. The laser annealing treatment apparatus according to claim 1, comprising a plurality of laser light sources, wherein beams of the pulse laser light output from the plurality of laser light sources are superimposed to output said pulse laser light for irradiating the semiconductor film.

3. The laser annealing treatment apparatus according to claim 2, wherein the semiconductor film to be irradiated by the pulse laser light is non single-crystalline silicon.

4. The laser annealing treatment apparatus according to claim 1, wherein the semiconductor film to be irradiated by the pulse laser light is non single-crystalline silicon.

5. The laser annealing treatment apparatus according to claim 1, wherein the pulse laser light is excimer laser.

* * * * *